United States Patent
Hunatsu

(10) Patent No.: US 6,473,520 B2
(45) Date of Patent: *Oct. 29, 2002

(54) PELLICLE, IDENTIFICATION SYSTEM OF THE SAME, AND METHOD OF IDENTIFYING THE SAME

(75) Inventor: Hiroyuki Hunatsu, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,148

(22) Filed: Feb. 8, 1999

(65) Prior Publication Data

US 2002/0102015 A1 Aug. 1, 2002

(30) Foreign Application Priority Data

Feb. 24, 1998 (JP) .............................. 10-041901

(51) Int. Cl.⁷ .............................. G06K 9/00; G03F 9/00
(52) U.S. Cl. .............................. 382/144; 382/147; 430/5
(58) Field of Search .................................. 382/144, 145, 382/147, 151, 146; 430/5, 11; 29/846

(56) References Cited

U.S. PATENT DOCUMENTS

| | | | | |
|---|---|---|---|---|
| 4,737,387 A | * | 4/1988 | Yen | 428/14 |
| 5,453,602 A | * | 9/1995 | Hanada | 235/439 |
| 5,453,816 A | * | 9/1995 | Wang | 355/75 |
| 5,483,741 A | * | 1/1996 | Akram et al. | 435/173.8 |
| 6,077,632 A | * | 6/2000 | Funatsu | 430/5 |

FOREIGN PATENT DOCUMENTS

| | | | | |
|---|---|---|---|---|
| JP | 3-20739 | | 1/1991 | |
| JP | 03083321 A | * | 4/1991 | H01L/21/027 |
| JP | 9-114085 | | 5/1997 | |

* cited by examiner

Primary Examiner—Joseph Mancuso
Assistant Examiner—Mehrdad Dastouri
(74) Attorney, Agent, or Firm—Volentine Francos, PLLC

(57) ABSTRACT

A pellicle in which a portion for identifying the pellicle, which comprises a conductive film and predetermined patterns composed of conductors formed on the conductive film, is attached to a pellicle frame labeled with a pellicle membrane, is fixed onto a mask and electrically connected to signal lines formed on the mask and predetermined patterns composed of conductors. A reader supplies a source potential to the conductive film and reads electric signals sent from the predetermined patterns each comprised of the conductor through signal lines. The pellicle is identified according to each read signal.

20 Claims, 5 Drawing Sheets

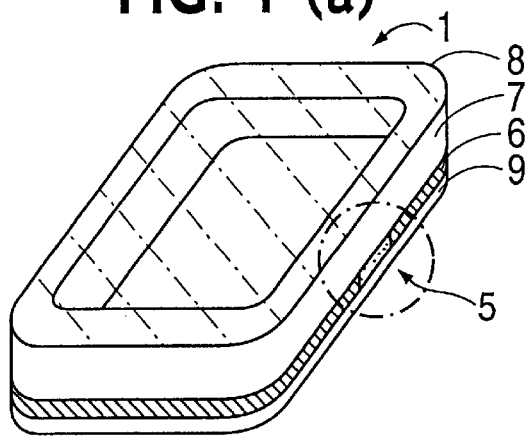
FIG. 1-(a)
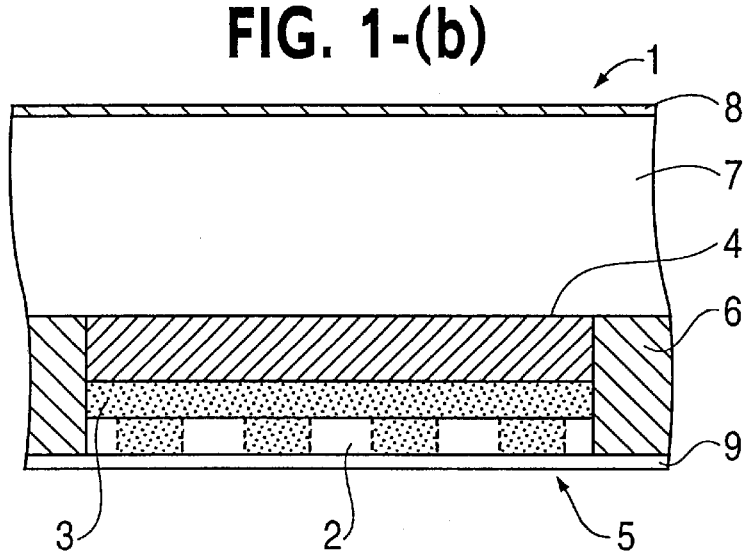
FIG. 1-(b)
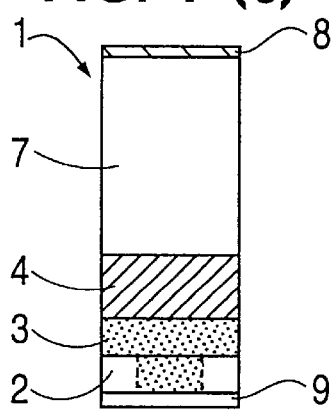
FIG. 1-(c)

FIG. 2-(a)
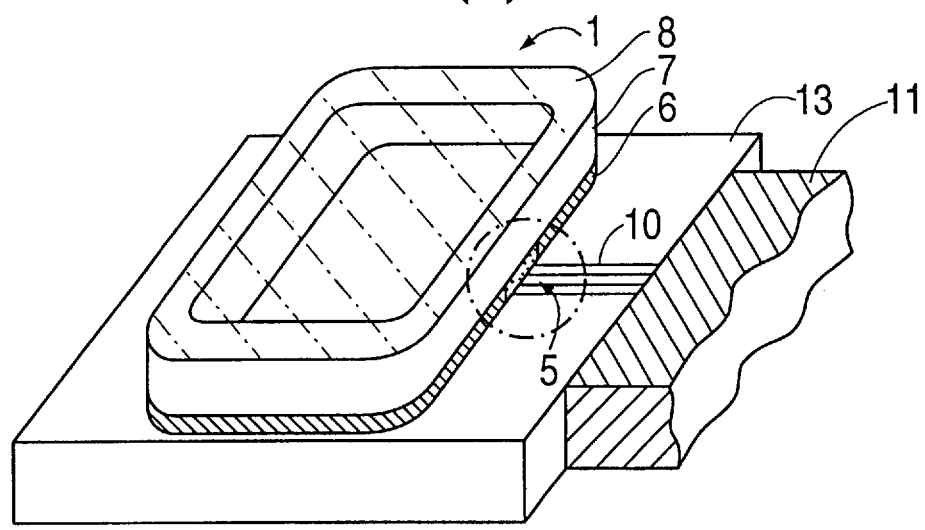
FIG. 2-(b)
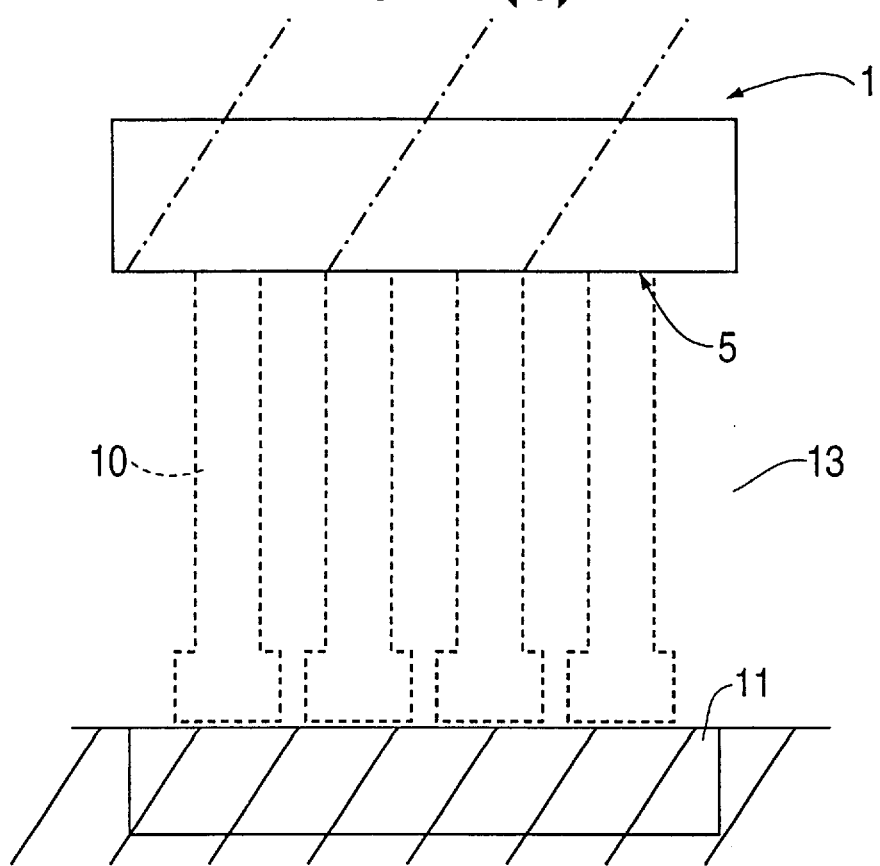

FIG. 3-(a)
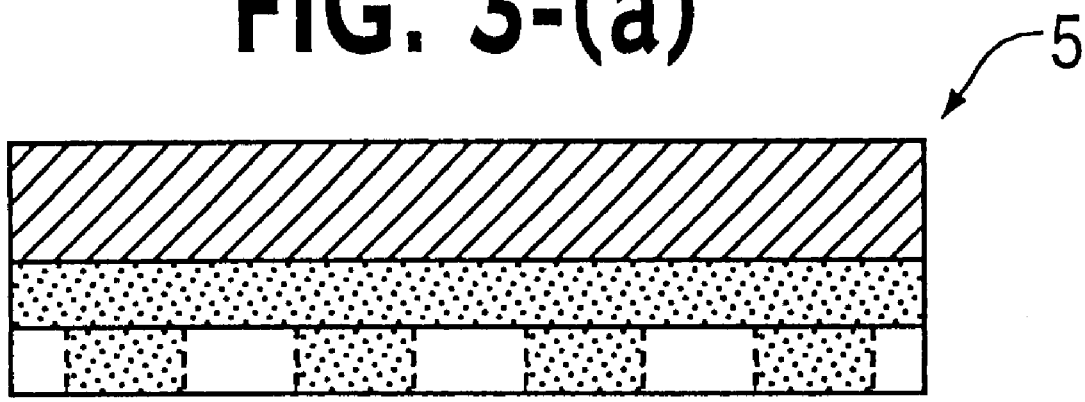
FIG. 3-(b)
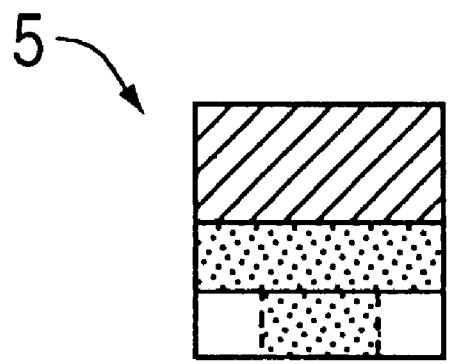

PELLICLE, IDENTIFICATION SYSTEM OF THE SAME, AND METHOD OF IDENTIFYING THE SAME

BACKGROUND OF THE INVENTION

1. Field of the Invention

This invention relates to a pellicle placed on a mask employed in a photolitho process corresponding to a part of processes for manufacturing a semiconductor integrated circuit, a system for identifying the pellicle, and a method of identifying the pellicle.

2. Description of the Related Art

In general, a mask is a semiconductor circuit pattern plate used when semiconductor patterns are transferred onto a wafer substrate.

This type of mask is one in which semiconductor circuit patterns are formed over a substrate such as quartz by a thin-film metal such as Cr or the like. There may be cases where a pellicle is placed on the mask to protect the surface of the mask from foreign particles such as dust or the like.

Upon control of the mask, information about the name (or figure number) a semiconductor manufactured by the mask, the name of its owner, a calendar, etc. are provided on the surface of the mask except for the semiconductor circuit patterns.

In recent years, there may be cases in which a figure number on a mask is displayed in the form of bar codes. When the mask is set to an exposure device in this case, the device automatically reads the figure number based on the bar codes to thereby lessen the load on a worker and prevent the worker from misreading the figure number.

In regard to the pellicle placed on the mask, a pellicle figure number is engraved or marked on the side of a pellicle frame. The pellicle drawing or figure number is determined according to the type of exposure device to be used and an exposure wavelength employed in the exposure device. The worker identifies the pellicle and uses it according to the figure number.

However, there may be cases in which when marks or the like capable of being handled with a plurality of exposure devices are placed within the mask in advance and the corresponding exposure devices used upon device development and device mass-production are selected, the present pellicles in use are renewed or changed to pellicles having different pellicle frame shapes according to the selected exposure devices and they are used. There may be cases in which even in the case of the same pellicle frame shapes, pellicle membrane placed on their pellicle frames are different in material from each other according to the exposure wavelength used in each exposure device.

In many cases, a pellicle membrane for G- and I-line wavelengths uses nitrocellulose as a raw material. A pericle film for a KrF excimer-ray's wavelength makes use of fluoropolymer as a material. The pellicle membrane for the KrF excimer-ray's wavelength has transmissivity sufficient for the G- and I-line wavelengths and also has resistance thereto. Conversely, the pellicle memmbrane for the G- and I-line wavelengths has transmissivity insufficient for the KrF excimer-ray's wavelength and resistance thereto insufficient therefor. When the KrF excimer-ray's wavelength is allowed to pass through the pellicle membrane for the G- and I-line wavelengths erroneously, the mask itself might be damaged as a result of impairment of the pellicle membrane.

It is thus necessary to select the proper pellicle before the pellicle is placed over the mask and confirm the pellicle on the mask before the exposure thereof by the exposure device. Particularly when the type of pellicle is renewed, an ID such as a bar code or the like formed on the mask in advance upon mask fabrication cannot cope with it.

SUMMARY OF THE INVENTION

With the foregoing in view, it is therefore an object of the present invention to provide a pellicle, an identification system thereof and a method of identifying the pellicle, which permit each individual identification with accuracy and ease.

According to one aspect of the invention, for achieving the above object, there is provided a pellicle, comprising: a pellicle membrane; a pellicle frame for sticking the pellicle membrane; a sticking portion provided on a surface of the pellicle frame , which is located on the side opposite to a sticking surface of the pellicle membrane; and a portion for identifying the pellicle, which comprises a conductive film and predetermined patterns composed of conductors formed on the conductive film.

According to another aspect of the invention, there is provided a pellicle identifying system, comprising: a pellicle including, a pellicle membrane; a pellicle frame for sticking the pellicle membrane; a sticking portion provided on a surface of the pellicle frame, which is located on the side opposite to a sticking surface of the pellicle membrane; and a portion for identifying the pellicle, which comprises a conductive film and predetermined patterns composed of conductors formed on the conductive film; signal lines electrically connected to the predetermined patterns respectively; and a reader for reading a signal from each signal line.

According to a further aspect of the invention, there is provided a pellicle identifying method, comprising the following steps of: fixing onto a mask, a pellicle including a pellicle membrane, a pellicle frame for sticking the pellicle membrane, a sticking portion provided on a surface of the pellicle frame, which is located on the side opposite to a sticking surface of the pellicle membrane, and a portion for identifying the pellicle, which comprises a conductive film and predetermined patterns composed of conductors formed on the conductive film; connecting the predetermined patterns to one ends of signal lines formed on the mask respectively; connecting a reader to the other ends of the signal lines; and supplying a source potential to the conductive film to read a signal from each of the signal lines connected to the predetermined patterns by the reader.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1-(a) is a view showing an overall configuration of a pellicle with an ID label;

FIG. 1-(b) is a partly front view illustrating the pellicle with the ID label;

FIG. 1-(c) is a partly cross-sectional view depicting the pellicle with the ID label;

FIG. 2-(a) is a view showing an overall configuration of a pellicle placed on the surface of a mask 13;

FIG. 2-(b) is an enlarged view of the neighborhood of an ID label of the pellicle shown in FIG. 2-(a);

FIG. 3-(a) is a front view illustrating an ID label structure;

FIG. 3-(b) is across-sectional view depicting the ID label structure shown in FIG. 3-(a);

DESCRIPTION OF THE PREFERRED EMBODIMENTS

Figure 4:
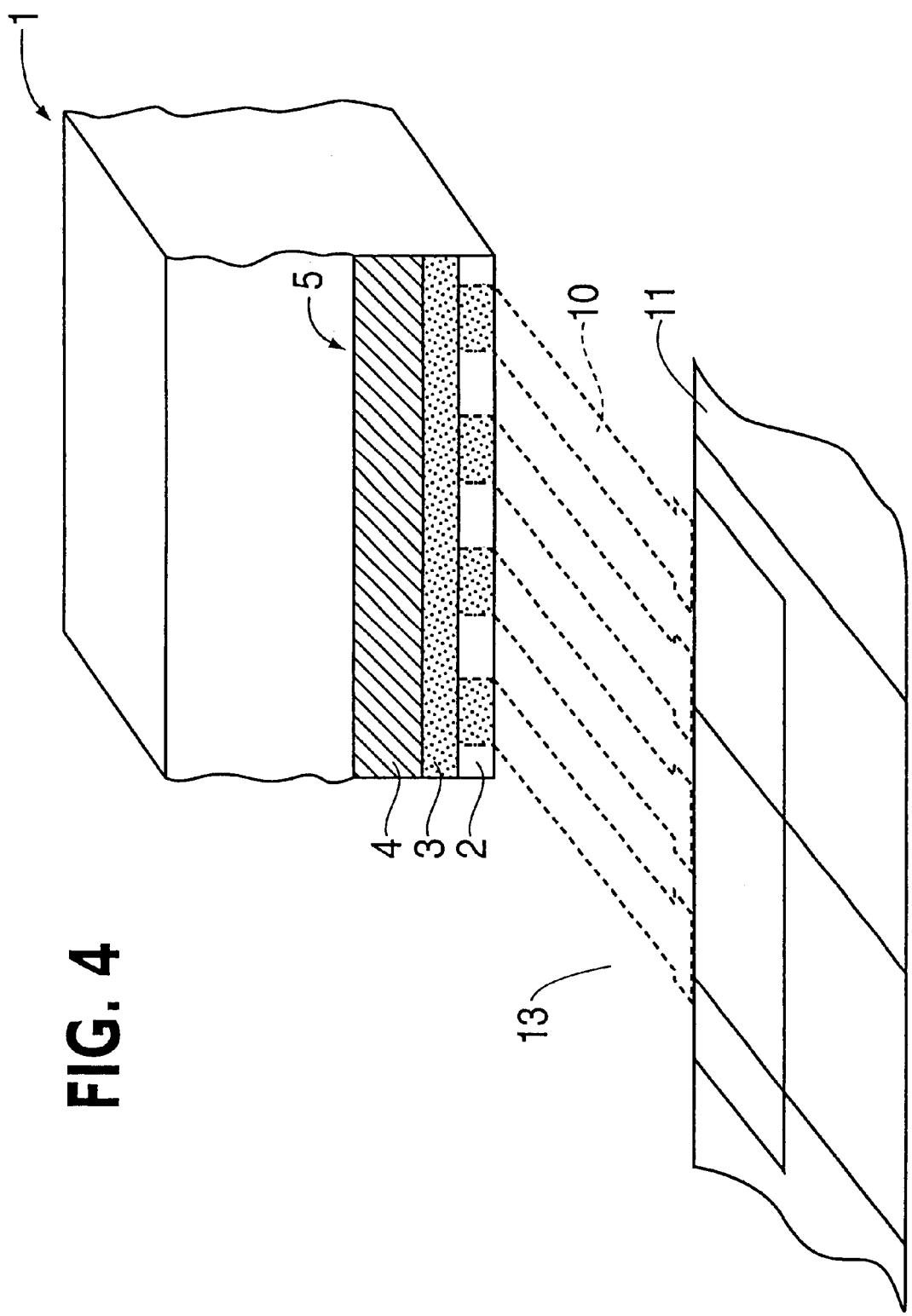
FIG. 4 is a view showing a first example of reading of a signal for an ID label employed in the present invention.

Preferred embodiments of the present invention will hereinafter be described with reference to the accompanying drawings. FIG. 1-(a) is a view showing an overall configuration of a pellicle with an ID label. FIG. 1-(b) is a partly front view illustrating the pellicle with the ID label. FIG. 1-(c) is a partly cross-sectional view depicting the pellicle with the ID label.

As shown in FIGS. 1-(a) through 1-(c), reference numerals 1, 2, 3, 4, 5, 6, 7, 8 and 9 indicate a pellicle, a pattern section for an ID label, a conductive portion, a sticker layer, the ID label, a sticker portion, a pellicle frame, a pellicle membrane and a liner, respectively.

Thus, the pellicle membrane 8 is placed over the pellicle frame 7 with an adhesive. The ID label 5 comprised of the pattern section 2, conductive portion 3 and sticker layer 4 is partly provided in the pellicle frame 7 from below. The liner 9 is bonded to the bottom of the pellicle frame 7. When the pellicle 1 is set to a mask (not shown), the line 9 is peeled off so that the bottom of the pellicle 1 is fixed to the mask with the sticker portion 6.

FIG. 2-(a) is a view showing an overall configuration of a pellicle placed over the surface of a mask 13. FIG. 2-(b) is an enlarged view of the neighborhood of an ID label thereof.

Referring to FIGS. 2-(a) and 2-(b), signal leading or deriving Cr patterns 10 are formed over the mask 13. The pellicle 1 with the ID label 5 attached thereto is bonded to the mask 13.

Namely, the pattern section 2 of the ID label 5 is placed so as to be superimposed on the signal deriving Cr patterns 10 formed over the surface of the mask 13. The pellicle 1 may simply be bonded to a predetermined position. The ID label 5 is identical in height to the sticker portion 6 so as not to impair the height of the pellicle 1.

Pellicle figure numbers, i.e., a figure number on a label lying outside a case with a pellicle held therein, or an ID inscription or marking on the side of a pellicle frame has heretofore been visually-read by a worker.

In the present invention, for example, a pellicle ID directly fixed to the pellicle frame 7 before a pellicle automatic mount system or the like labels the mask 13 with the pellicle 1, can be electrically read by a pellicle ID reader 11.

FIG. 3-(a) is a front view showing an ID label structure. FIG. 3-(b) is a cross-sectional view illustrating the ID label structure.

As shown in FIGS. 3-(a) and 3-(b), the ID label 5 consists of three parts: the sticker layer 4, the conductive portion (upper layer) 3 and the pattern section (lower layer) 2. The pattern section 2 corresponds to a portion brought into contact with the signal deriving Cr patterns 10 placed on the mask and serves so as to identify each signal according to the presence or absence of each contact portion. At least one contact portion of the pattern section 2 functions as a contact portion used for a power supply. The ID label 5 is a thin-film label made up of an electrical conductor and a non-conductor and is fixed to a sticker surface of the pellicle frame 7 (see FIG. 10-(a)). Now, the non-conductor can be implemented even by forming the corresponding contact portion with an insulator.

An example of reading of a signal on the ID label employed in the present invention will be explained.

FIG. 4 is a view showing a first example of reading of a signal for an ID label employed in the present invention. The pattern section 2 of the ID label includes four contact portions, which are electrically in contact with their corresponding signal deriving Cr patterns 10 placed on the mask 13. A description will now be made of the case in which the power supply is 5V.

One of the contact portions is used for the common power supply. For example, the power is supplied from the pellicle ID reader 11 through the corresponding signal deriving Cr pattern 10. In the first reading example, the power supply of 5V is supplied to the other contact portions through the conductive portion (upper layer) 3 when the power supply of 5V is supplied to the contact portion for the power supply. A 5V signal corresponding to the other contact portions can be inputted to and read by the externally-placed pellicle ID reader 11 through the signal leading Cr patterns 10 placed on the mask 13.

Figure 5:
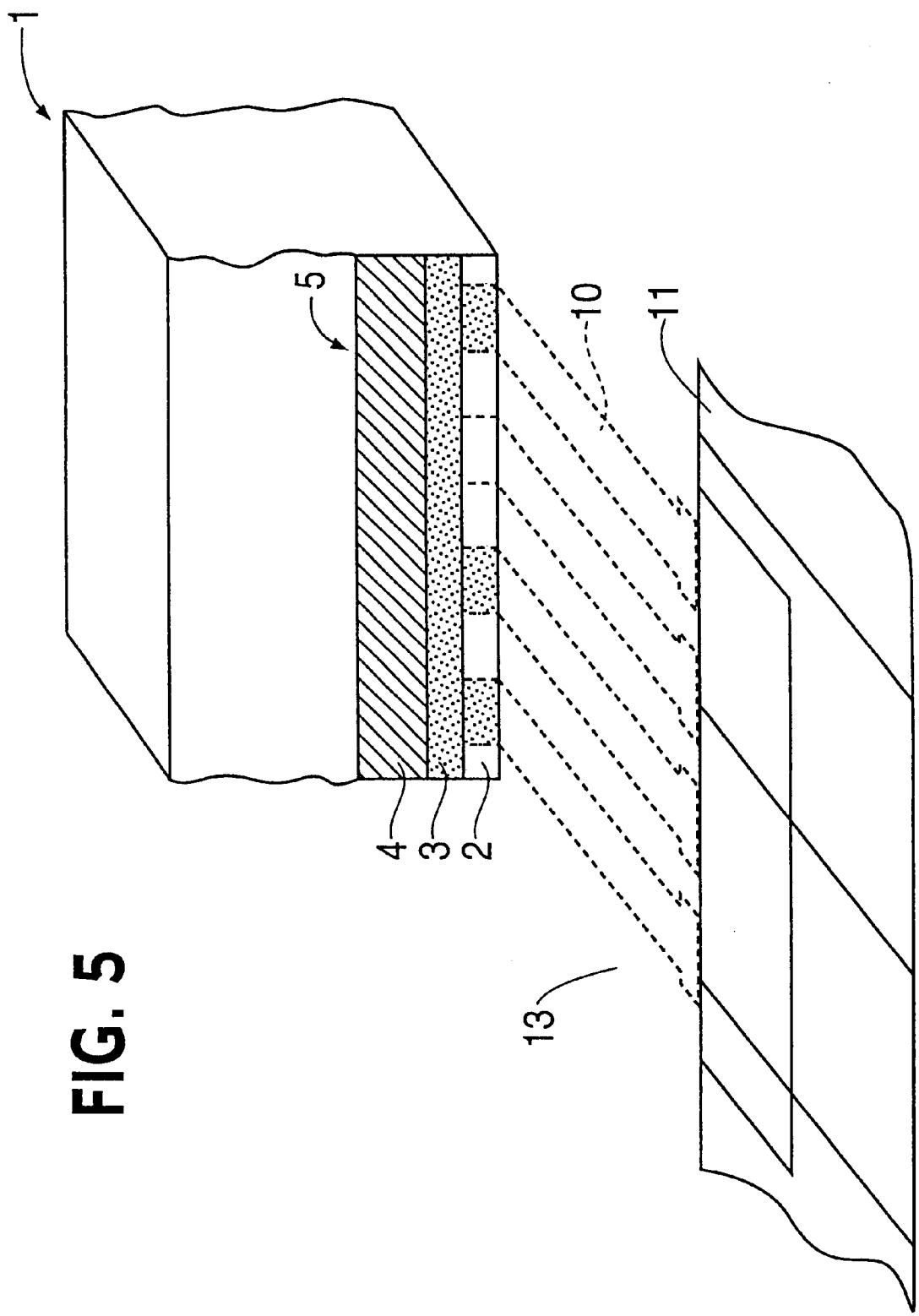
FIG. 5 is a view illustrating a second example of reading of a signal for an ID label employed in the present invention.

FIG. 5 is a view showing a second example of reading of a signal for the ID label employed in the present invention. The pattern section 2 of the ID label 5 includes three contact portions, which are electrically in contact with their corresponding signal deriving Cr patterns 10 placed on the mask 13. A description will now be made of the case in which the power supply is 5V in a manner similar to the first reading example.

In the second reading example, the two contact portions other than the contact portion for the power supply are electrically in contact with their corresponding signal deriving Cr patterns 10 on the mask 13. The pattern section 2 includes ones in non-contact with the signal deriving Cr patterns 10 on the mask 13. In other words, the pattern section 2 is not provided with contact portions corresponding to the signal deriving Cr patterns 10 on the mask 13. As a result, when the contact portion for the power supply is supplied with the power supply of 5V, a 5V signal is supplied to the signal deriving Cr pattern 10 on the mask 10 and a 0V signal is supplied to the signal deriving Cr patterns 10 on the mask 13, which are not brought into contact with the contact portions. Thus, the number of the signal deriving Cr patterns 10 on the mask 13 increases and an identification combination increases according to the presence or absence of their corresponding contact portions of the pattern section 2. As an alternative to the formation of the contact portions in the pattern section 2 as previously mentioned, contact portions each comprised of an insulator may be formed.

Operation of the present embodiment will be explained below.

In the pellicle automatic mount system, for example, a pellicle 1 is fed from a pellicle frame 7 to a pellicle mount portion with a robot hand. After its feeding, the pellicle 1 is fixed to a mounter portion through the use of holes defined in the side of the pellicle frame 7. In this state, an electrically-read contact portion is brought into contact with a pellicle ID to read the pellicle ID. When a pellicle figure is found to be proper after the reading of the pellicle ID, label working is executed.

According to the present embodiment as described above, the pellicle ID of the pellicle itself, which is made up of the electrical conductor and the non-conductor, is fixed to the pellicle frame 7 itself and electrically read. Therefore, even when an erroneous figure number is displayed on a label placed on the pellicle frame 7, for example, the influence of its display is not exerted. Further, even when the pellicle is changed in the course of its use, it is possible to cope even with its change. Since it is not necessary to inscribe or mark the pellicle ID on the side of the pellicle frame 7, for example, a bad effect exerted on exposure due to reflection from marking or the like upon exposure is not produced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A pellicle comprising:
   a frame body having a first surface and a second surface opposite the first surface;
   a pellicle membrane adhered to the first surface of said frame body;
   an adhesive layer having a first surface and a second surface opposite the first surface, wherein the first surface of said adhesive layer is attached to the second surface of said frame body; and
   a pellicle identifying structure comprising a conductive film having a first surface attached to the second surface of said adhesive layer and a patterned conductor formed on a second surface of said conductive film which is opposite the first surface of the conductive film, wherein the patterned conductor includes a plurality of spaced apart conductive members which extend in length and width along the second surface of the conductive film and which extend in height away from the second surface of the conductive film.

2. The pellicle according to claim 1, wherein said pellicle identifying structure is contained within a recess formed within the second surface of said adhesive layer.

3. The pellicle according to claim 1, further comprising a source potential supplied to said conductive film.

4. The pellicle according to claim 2, wherein said conductive film is attached to a bottom of said recess within said second surface of said adhesive layer, and wherein a first surface of said patterned conductor is attached to said conductive film, and wherein an opposite second surface of said patterned conductor is level with a top of said recess.

5. The pellicle of claim 4, further comprising a removable liner attached to the second surface of said adhesive layer and extending across said recess.

6. The pellicle of claim 2, wherein the pellicle identifying structure is electronically readable by a machine which is electrically connected to pellicle identifying structure.

7. A pellicle comprising:
   a frame body having a first surface and a second surface opposite the first surface;
   a pellicle membrane adhered to the first surface of said frame body;
   an adhesive layer having a first surface and a second surface opposite the first surface, wherein the first surface of said adhesive layer is attached to the second surface of said frame body; and
   a pellicle identifying structure comprising a conductive film having a first surface attached to the second surface of said adhesive layer and a patterned layer formed on a second surface of said conductive film which is opposite the first surface of said conductive film, wherein the patterned conductor includes a plurality of spaced apart conductive members which extend in length and width along the second surface of the conductive film and which extend in height away from the second surface of the conductive film, and a plurality of insulating members interposed between the conductive members.

8. The pellicle according to claim 7, wherein said pellicle identifying structure is contained within a recess formed within the second surface of said adhesive layer.

9. The pellicle according to claim 7, further comprising a source potential supplied to said conductive film.

10. The pellicle according to claim 8, wherein said conductive film is attached to a bottom of said recess within said second surface of said adhesive layer, and wherein a first surface of said patterned layer is attached to said conductive film, and wherein an opposite second surface of said patterned layer is level with a top of said recess.

11. The pellicle of claim 10, further comprising a removable liner attached to the second surface of said adhesive layer and extending across said recess.

12. The pellicle of claim 7, wherein the pellicle identifying structure is electronically readable by a machine which is electrically connected to pellicle identifying structure.

13. A pellicle identifying system, comprising:
   a pellicle including (a) a frame body having a first surface and a second surface opposite the first surface, (b) a pellicle membrane adhered to the first surface of said frame body, (c) an adhesive layer having a first surface and a second surface opposite the first surface, wherein the first surface of said adhesive layer is attached to the second surface of said frame body, and (d) a pellicle identifying structure comprising a conductive film having a first surface attached to the second surface of said adhesive layer and a patterned conductor formed on a second surface of said conductive film which is opposite the first surface of the conductive film, wherein the patterned conductor includes a plurality of spaced apart conductive members which extend in length and width along the second surface of the conductive film and which extend in height away from the second surface of the conductive film;
   signal lines which are electrically connected to said patterned conductors, respectively; and
   a reader for reading signals from each of said signal lines.

14. The pellicle identifying system according to claim 13, wherein said signal lines are formed on a mask for fabricating a semiconductor device.

15. The pellicle identifying system according to claim 14, wherein said signal lines are composed of chromium.

16. A pellicle identifying system, comprising:
   a pellicle including (a) a frame body having a first surface and a second surface opposite the first surface, (b) a pellicle membrane adhered to the first surface of said frame body, (c) an adhesive layer having a first surface and a second surface opposite the first surface, wherein the first surface of said adhesive layer is attached to the second surface of said frame body, and (d) a pellicle identifying structure comprising a conductive film having a first surface attached to the second surface of said adhesive layer and a patterned layer formed on a second surface of said conductive film which is opposite the first surface of said conductive film, wherein the patterned conductor includes a plurality of spaced apart conductive members which extend in length and width along the second surface of the conductive film and which extend in height away from the second surface of the conductive film, and a plurality of insulating members interposed between the conductive members;

signal lines which are electrically connected to said conductors, respectively; and a reader for reading signals from each of said signal lines.

17. The pellicle identifying system according to claim 16, wherein said signal lines are formed on a mask for fabricating a semiconductor device.

18. The pellicle identifying system according to claim 17, wherein said signal lines are composed of chromium.

19. A pellicle identifying method, comprising:

attaching a pellicle to a mask, said pellicle including (a) a frame body having a first surface and a second surface opposite the first surface, (b) a pellicle membrane adhered to the first surface of said frame body, (c) an adhesive layer having a first surface and a second surface opposite the first surface, wherein the first surface of said adhesive layer is attached to the second surface of said frame body, and (d) a pellicle identifying structure comprising a conductive film having a first surface attached to the second surface of said adhesive layer and a patterned conductor formed on a second surface of said conductive film which is opposite the first surface of the conductive film, wherein the patterned conductor includes a plurality of spaced apart conductive members which extend in length and width along the second surface of the conductive film and which extend in height away from the second surface of the conductive film;

connecting said patterned conductors to one ends of respective signal lines formed on said mask;

connecting a reader to the other ends of said respective signal lines; and supplying a source potential to said conductive film;

using said reader to read a signal from each of said signal lines connected to said patterned conductors while the source potential is supplied to said conductive film.

20. A pellicle identifying method, comprising:

fixing onto a mask, a pellicle including (a) a frame body having a first surface and a second surface opposite the first surface, (b) a pellicle membrane adhered to the first surface of said frame body, (c) an adhesive layer having a first surface and a second surface opposite the first surface, wherein the first surface of said adhesive layer is attached to the second surface of said frame body, and (d) a pellicle identifying structure comprising a conductive film having a first surface attached to the second surface of said adhesive layer and a patterned layer formed on a second surface of said conductive film which is opposite the first surface of said conductive film, wherein the patterned conductor includes a plurality of spaced apart conductive members which extend in length and width along the second surface of the conductive film and which extend in height away from the second surface of the conductive film, and a plurality of insulating members interposed between the conductive members;

connecting said conductors to one ends of respective signal lines formed on said mask;

connecting a reader to the other ends of said respective signal lines; and supplying a source potential to said conductive film;

using said reader to read a signal from each of said signal lines connected to said conductors while the source potential is supplied to said conductive film.

* * * * *